(12) United States Patent
Kuo et al.

(10) Patent No.: US 11,056,536 B2
(45) Date of Patent: Jul. 6, 2021

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chih-Wei Kuo, Tainan (TW);
Tai-Cheng Hou, Tainan (TW);
Yu-Tsung Lai, Tainan (TW);
Jiunn-Hsiung Liao, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/544,923

(22) Filed: Aug. 20, 2019

(65) Prior Publication Data

US 2021/0020693 A1 Jan. 21, 2021

(30) Foreign Application Priority Data

Jul. 17, 2019 (TW) ................. 108125208

(51) Int. Cl.
*H01L 27/22* (2006.01)
*H01L 43/12* (2006.01)
*H01L 43/08* (2006.01)
*H01L 43/02* (2006.01)

(52) U.S. Cl.
CPC ............ *H01L 27/228* (2013.01); *H01L 43/02* (2013.01); *H01L 43/08* (2013.01); *H01L 43/12* (2013.01)

(58) Field of Classification Search
CPC ...................................... H01L 27/222
See application file for complete search history.

(56) References Cited

U.S. PATENT DOCUMENTS

2018/0309051 A1* 10/2018 Deshpande ............ H01L 27/222
2020/0006641 A1* 1/2020 Liou ........................ H01L 43/02

\* cited by examiner

*Primary Examiner* — Jae Lee
(74) *Attorney, Agent, or Firm* — Winston Hsu

(57) ABSTRACT

A method for fabricating semiconductor device includes the steps of: forming a first magnetic tunneling junction (MTJ) and a second MTJ on a substrate; forming a first top electrode on the first MTJ and a second top electrode on the second MTJ; forming a passivation layer on the first MTJ and the second MTJ; removing part of the passivation layer so that a top surface of all of the remaining passivation layer is lower than a top surface of the first electrode; and forming a ultra low-k (ULK) dielectric layer on the first MTJ and the second MTJ.

1 Claim, 10 Drawing Sheets

US 11,056,536 B2

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of: forming a first magnetic tunneling junction (MTJ) and a second MTJ on a substrate; forming a first top electrode on the first MTJ and a second top electrode on the second MTJ; forming a passivation layer on the first MTJ and the second MTJ; removing part of the passivation layer so that a top surface of all of the remaining passivation layer is lower than a top surface of the first electrode; and forming a ultra low-k (ULK) dielectric layer on the first MTJ and the second MTJ.

According to another aspect of the present invention, a semiconductor device includes: a first magnetic tunneling junction (MTJ) and a second MTJ on a substrate; a first top electrode on the first MTJ and a second top electrode on the second MTJ; a passivation layer between the first MTJ and the second MTJ, wherein a top surface of the passivation layer comprises a V-shape; and an ultra low-k (ULK) dielectric layer on the passivation layer and around the first MTJ and the second MTJ.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
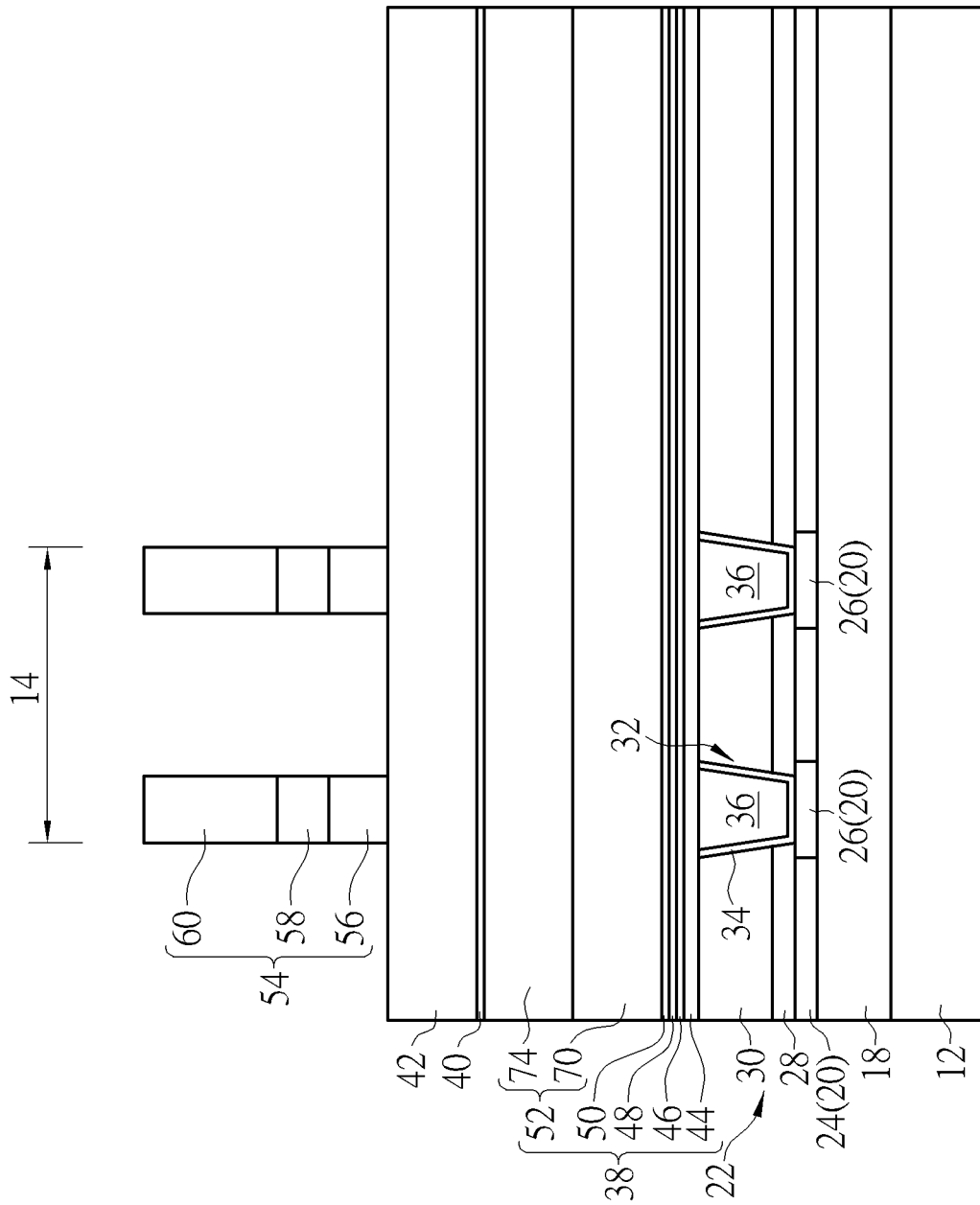
FIGS. 1-7 illustrate a method for fabricating a MRAM device according to an embodiment of the present invention.

Referring to FIGS. 1-7, FIGS. 1-7 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region (not shown) are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region 14 and the edge region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and each of the metal interconnections 32 from the metal interconnect structure 22 on the MTJ region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a MTJ stack 38 or stack structure is formed on the metal interconnect structure 22, a cap layer 40 is formed on the MTJ stack 38, and another cap layer 42 formed on the cap layer 40. In this embodiment, the formation of the MTJ stack 38 could be accomplished by sequentially depositing a first electrode layer 44, a fixed layer 46, a barrier layer 48, a free layer 50, and a second electrode layer 52 on the IMD layer 30. In this embodiment, the first electrode layer 44 and the second electrode layer 52 are preferably made of conductive material including but not limited to for example Ti, Ta, Pt, Cu, Au, Al, or combination thereof, in which the second electrode layer 52 further includes an electrode layer 70 made of Ta and an electrode layer 74 made of Ti. The fixed layer 46 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 46 is formed to fix or limit the direction of magnetic moment of adjacent layers. The barrier layer 48 could be made of insulating material including but not limited to for example oxides such as aluminum oxide ($AlO_x$) or magnesium oxide (MgO). The free layer 50 could be made of ferromagnetic material including but not limited to for example iron, cobalt, nickel, or alloys thereof such as cobalt-iron-boron (CoFeB), in which the magnetized direction of the free layer 50 could be altered freely depending on the influence of outside magnetic field. Preferably, the cap layer 40 and cap layer 42 are made of different materials. For instance, the cap layer 40 is preferably made of silicon nitride and the cap layer 42 is made of silicon oxide, but not limited thereto.

Next, a patterned mask 54 is formed on the cap layer 42. In this embodiment, the patterned mask 54 could include an organic dielectric layer (ODL) 56, a silicon-containing hard mask bottom anti-reflective coating (SHB) 58, and a patterned resist 60.

Figure 2:
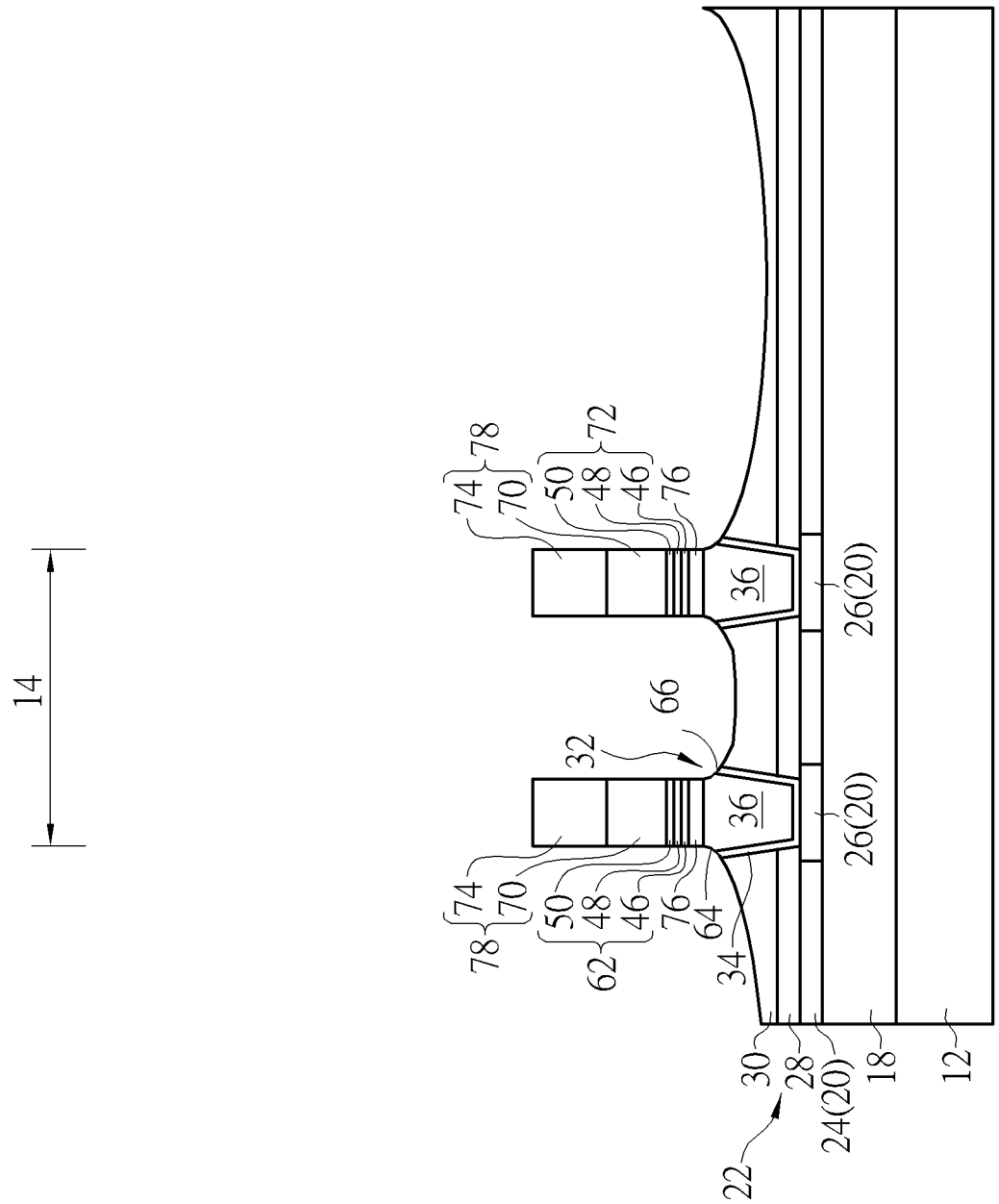

Next, as shown in FIG. 2, one or more etching process is conducted by using the patterned mask 54 as mask to remove part of the cap layers 40, 42, part of the MTJ stack 38, and part of the IMD layer 30 to form MTJ 62 and MTJ 72 on the MTJ region 14, in which the first electrode layer 44 at this stage preferably becomes a bottom electrode 76 for the MTJs 62, 72 while the second electrode layer 52 becomes a top electrode 78 for the MTJs 62, 72 and the cap layers 40, 42 could be removed during the etching process. It should be noted that this embodiment preferably conducts a reactive ion etching (RIE) process by using the patterned mask 54 as mask to remove part of the cap layers 40, 42 and part of the MTJ stack 38, strips the patterned mask 54, and then conducts an ion beam etching (IBE) process by using the patterned cap layer 42 as mask to remove part of the MTJ stack 38 and part of the IMD layer 30 to form MTJs 62, 72. Due to the characteristics of the IBE process, the top surface of the remaining IMD layer 30 is slightly lower than the top surface of the metal interconnections 32 after the IBE process and the top surface of the IMD layer 30 also reveals a curve or an arc.

It should also be noted that when the IBE process is conducted to remove part of the IMD layer 30, part of the metal interconnections 32 are removed at the same time so that a first slanted sidewall 64 and a second slanted sidewall 66 are formed on the metal interconnections 32 adjacent to the MTJ 62, in which each of the first slanted sidewall 64 and the second slanted sidewall 66 could further include a curve (or curved surface) or a planar surface.

Figure 3:
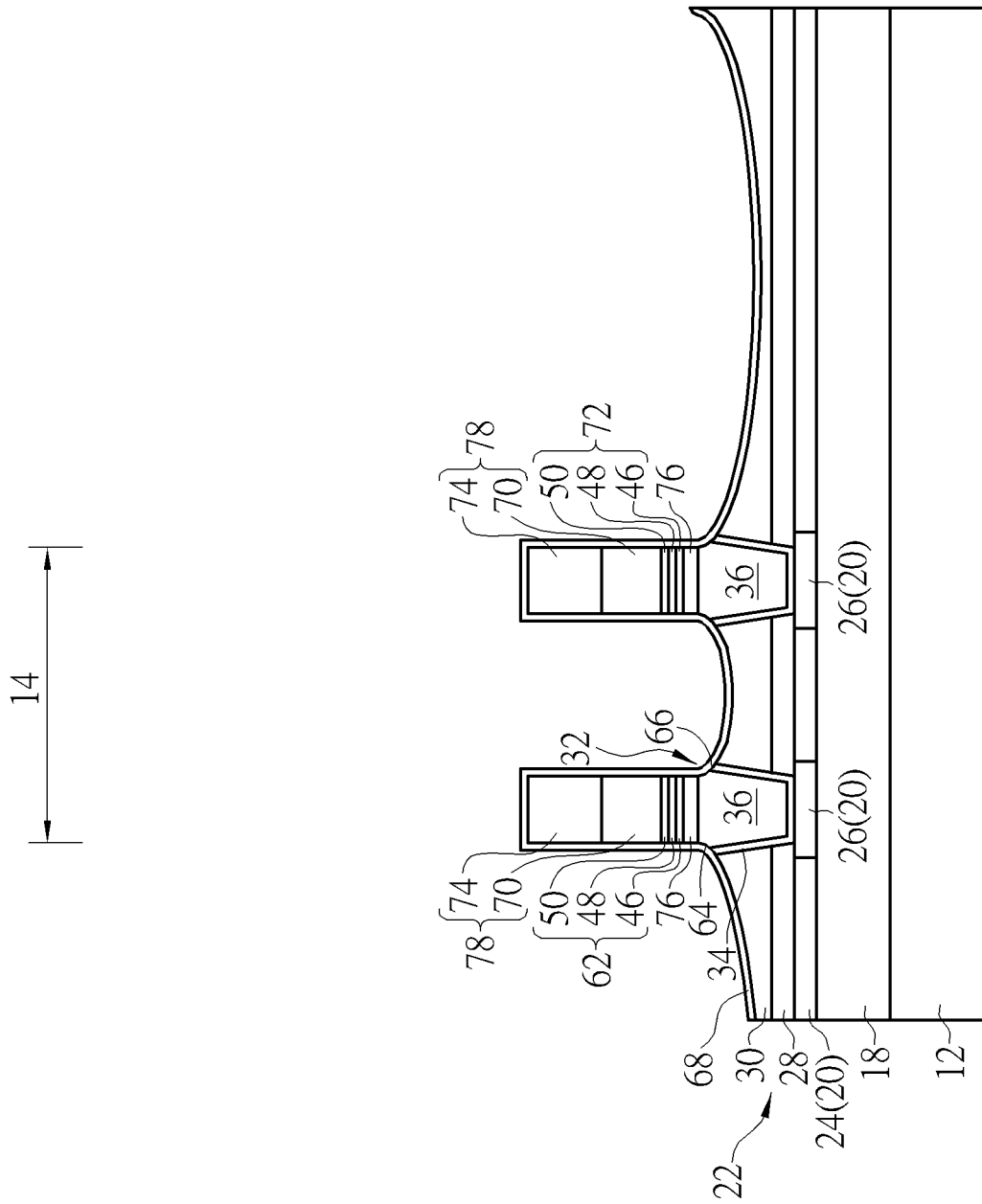

Next, as shown in FIG. 3, a cap layer 68 is formed on the MTJ 62, 72 to cover the surface of the IMD layer 30. In this embodiment, the cap layer 68 is preferably made of silicon nitride, but could also be made of other dielectric material including but not limited to for example silicon oxide, silicon oxynitride, or silicon carbon nitride.

Figure 4:
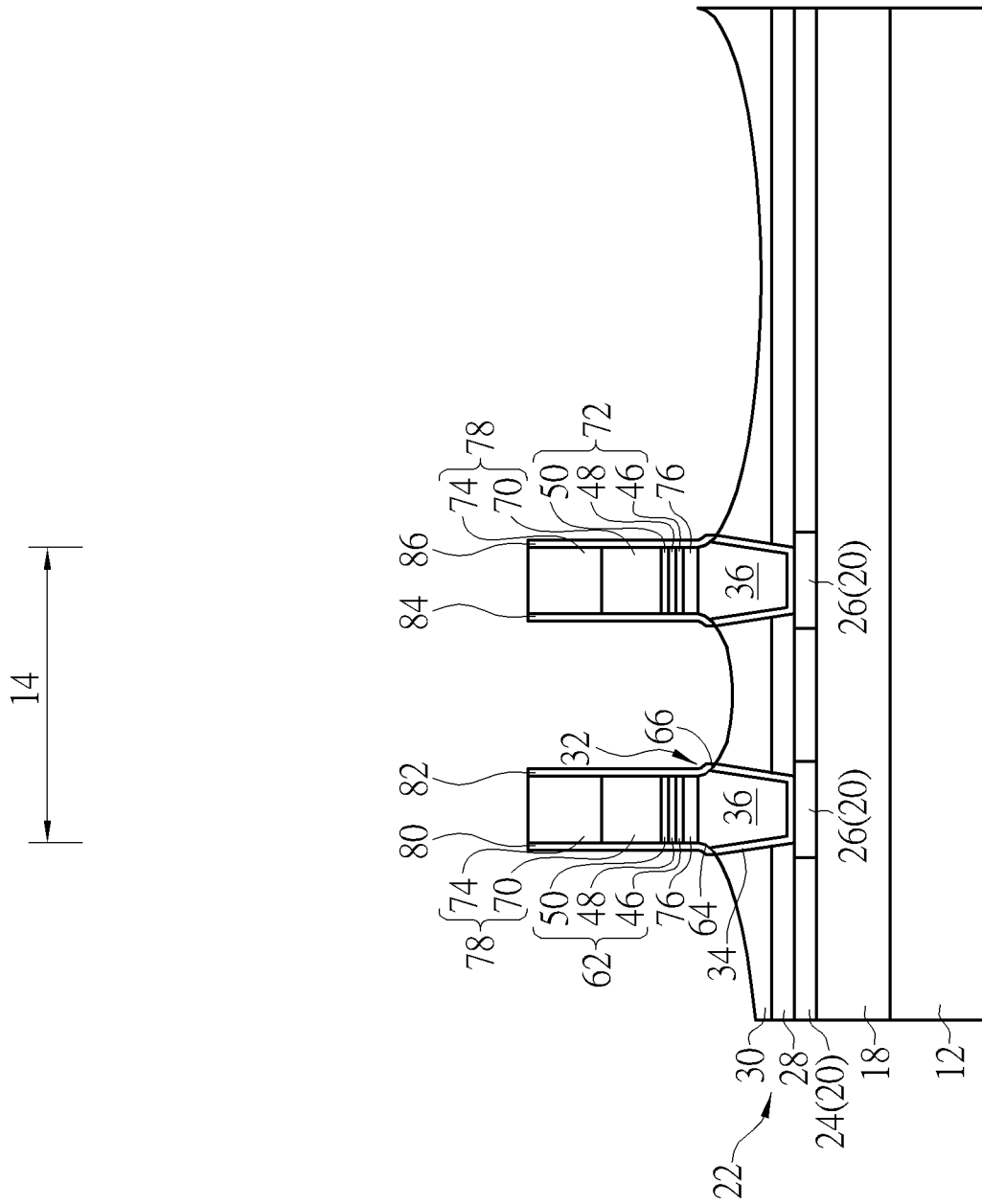

Next, as shown in FIG. 4, an etching process is conducted to remove part of the cap layer 68 to form spacers 80, 82 adjacent to the MTJ 62 and spacer 84, 86 adjacent to the MTJ 72, in which the spacers 80, 82, 84, 86 are disposed on the sidewalls of the MTJs 62, 72 and at the same time covering and contacting the first slanted sidewalls 64 and second slanted sidewalls 66 of the metal interconnections 32 directly.

Figure 5:
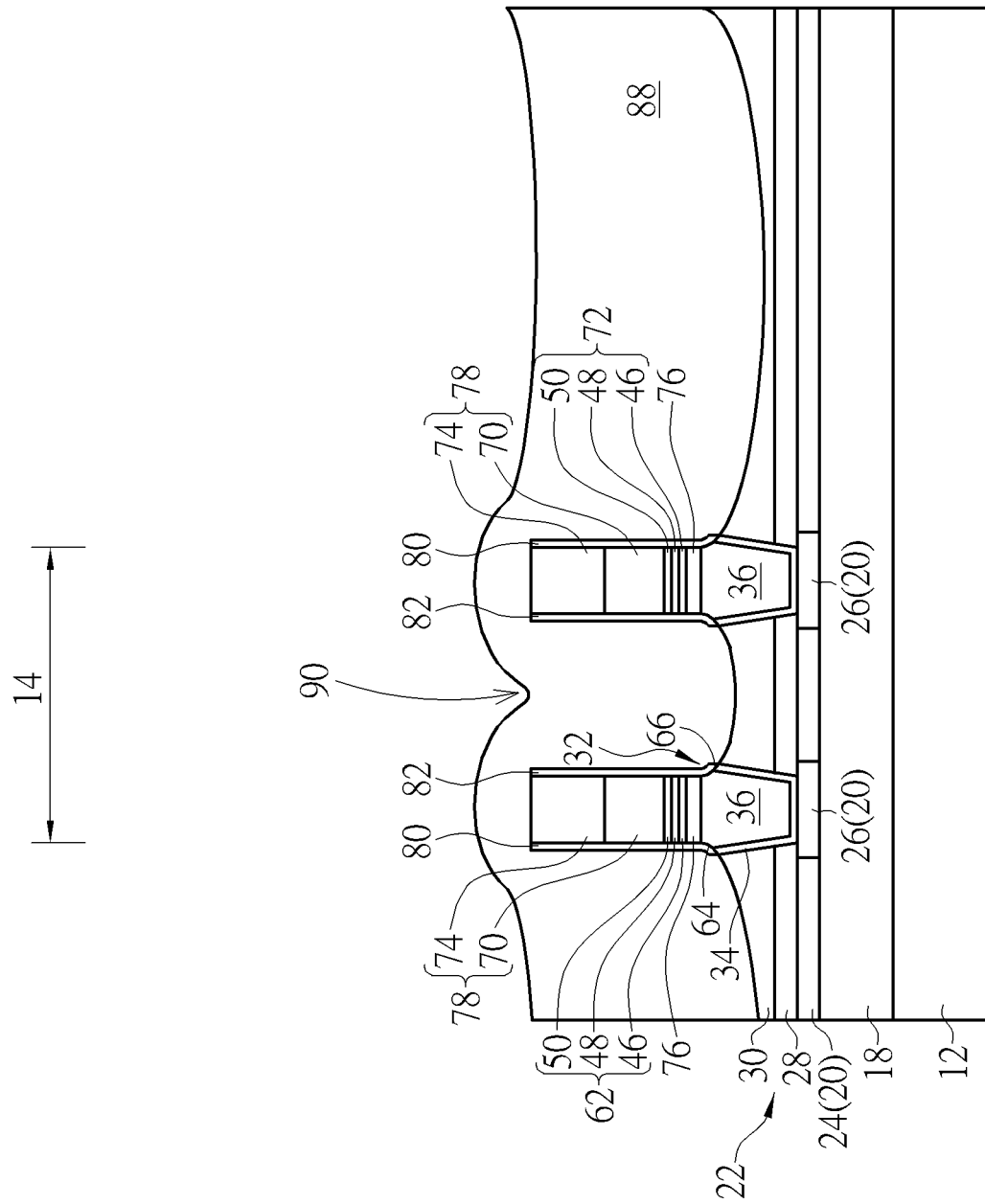

Next, as shown in FIG. 5, an atomic layer deposition (ALD) process is conducted to form a passivation layer 88 on the surface of the IMD layer 30 to cover the MTJs 62, 72 completely while the top surface of the passivation layer 88 is higher than the top surface of the MTJs 62, 72. It should be noted that at this stage the top surface of the passivation layer 88 directly on top of the MTJs 62, 72 preferably forms one or more surface concave downward while the top surface of the passivation layer 88 between the MTJs 62, 72 forms a surface concave upward and a recess 90 is formed between the MTJs 62, 72, in which the angle included by the recess 90 is preferably greater than 90 degrees or most preferably at 97 degrees.

Figure 6:
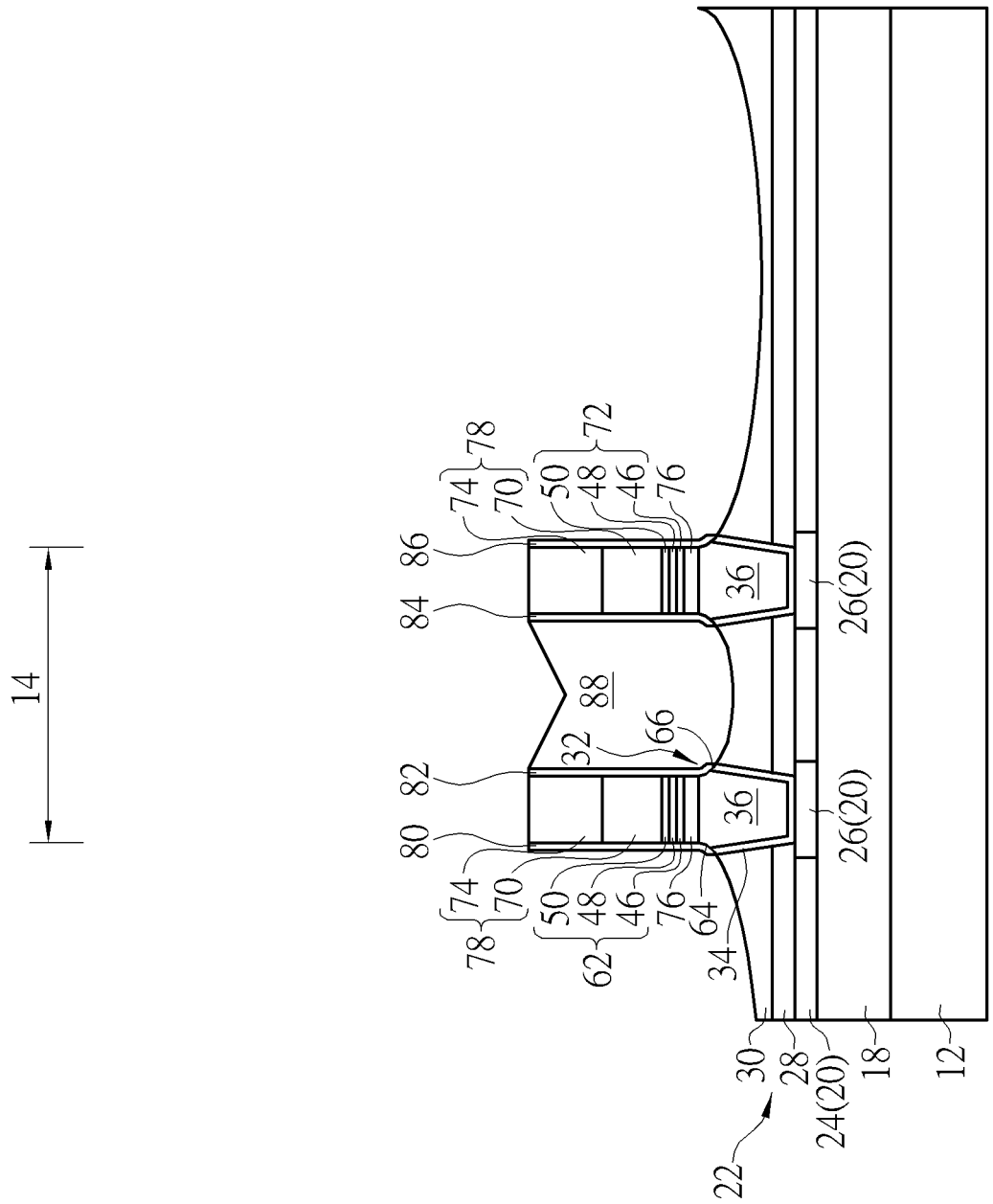

Next, as shown in FIG. 6, an etching back process is conducted to remove part of the passivation layer 88 so that the top surface of all of the remaining passivation layer 88 is less than the top surface of the top electrode 78. Specifically, all of the passivation layer 88 adjacent to the spacers 80, 86 are removed at the stage so that all of the remaining passivation layer 88 is between the spacers 82, 84, in which the top surface of the remaining passivation layer 88 between the MTJs 62, 72 includes a V-shape, all of the V-shape is lower than the top surface of the top electrode 78, and the angle included by the V-shape is preferably greater than 100 degrees.

Figure 7:
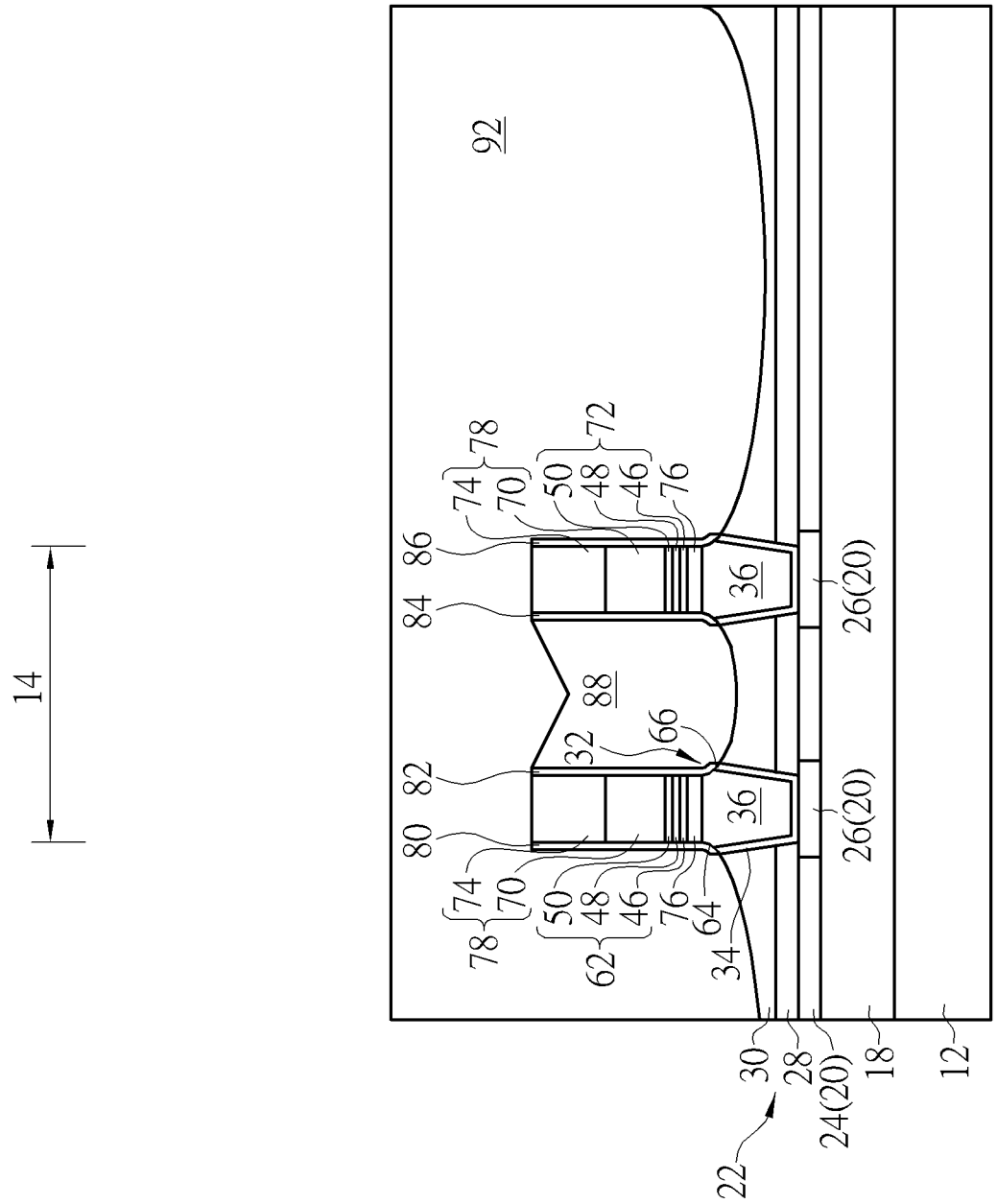

Next, as shown in FIG. 7, an ultra low-k (ULK) dielectric layer 92 is formed on the passivation layer 88, a planarizing process such as a chemical mechanical polishing (CMP) process is conducted to remove part of the ULK dielectric layer 92, and a metal interconnective process is conducted to form IMD layers (not shown) and metal interconnections (not shown) embedded within the IMD layers for electrically connecting the MTJs 62, 72. Since the formation of IMD layers and metal interconnections electrically connecting the MTJs 62, 72, are well known to those skilled in the art, the details of which are not explained herein for the sake of brevity. This completes the fabrication of a MRAM device according to an embodiment of the present invention.

Referring again to FIG. 7, FIG. 7 further illustrates a structural view of a semiconductor device according to an embodiment of the present invention. As shown in FIG. 7, the semiconductor device preferably includes an IMD layer 30 disposed on the substrate 12, metal interconnections 32 disposed within the IMD layer 30, MTJs 62, 72 disposed on the metal interconnections 32, bottom electrodes 76 disposed between the MTJs 62, 72 and metal interconnections 32, top electrodes 78 disposed on the MTJs 62, 72, spacers 80, 82 disposed adjacent to two sides of the MTJ 62, spacers 84, 86 disposed adjacent to two sides of the MTJ 72, a passivation layer 88 disposed between the MTJs 62, 72, and a ULK dielectric layer 92 disposed on the passivation layer 88 and surrounding the MTJs 62, 72.

Viewing from a more detailed perspective, the top surface of the passivation layer 88 includes V-shape, all of the V-shape is lower than the top surface of the top electrodes 78, and the angle included by the V-shape is greater than 100 degrees. The passivation layer 88 preferably contacts the spacers 82, 84 directly, the passivation layer 88 between the spacers 82, 84 contacts the IMD layer 30 directly, and the ULK dielectric layer 92 contacts the top electrodes 78 directly. The passivation layer 88 and the ULK dielectric layer 92 are preferably made of different materials, in which the passivation layer 88 preferably includes silicon oxide but could also include other dielectric material including but not limited to for example tetraethyl orthosilicate (TEOS), silicon nitride, or combination thereof while the ULK dielectric layer 92 could include porous dielectric materials including but not limited to for example silicon oxycarbide (SiOC).

Figure 8:
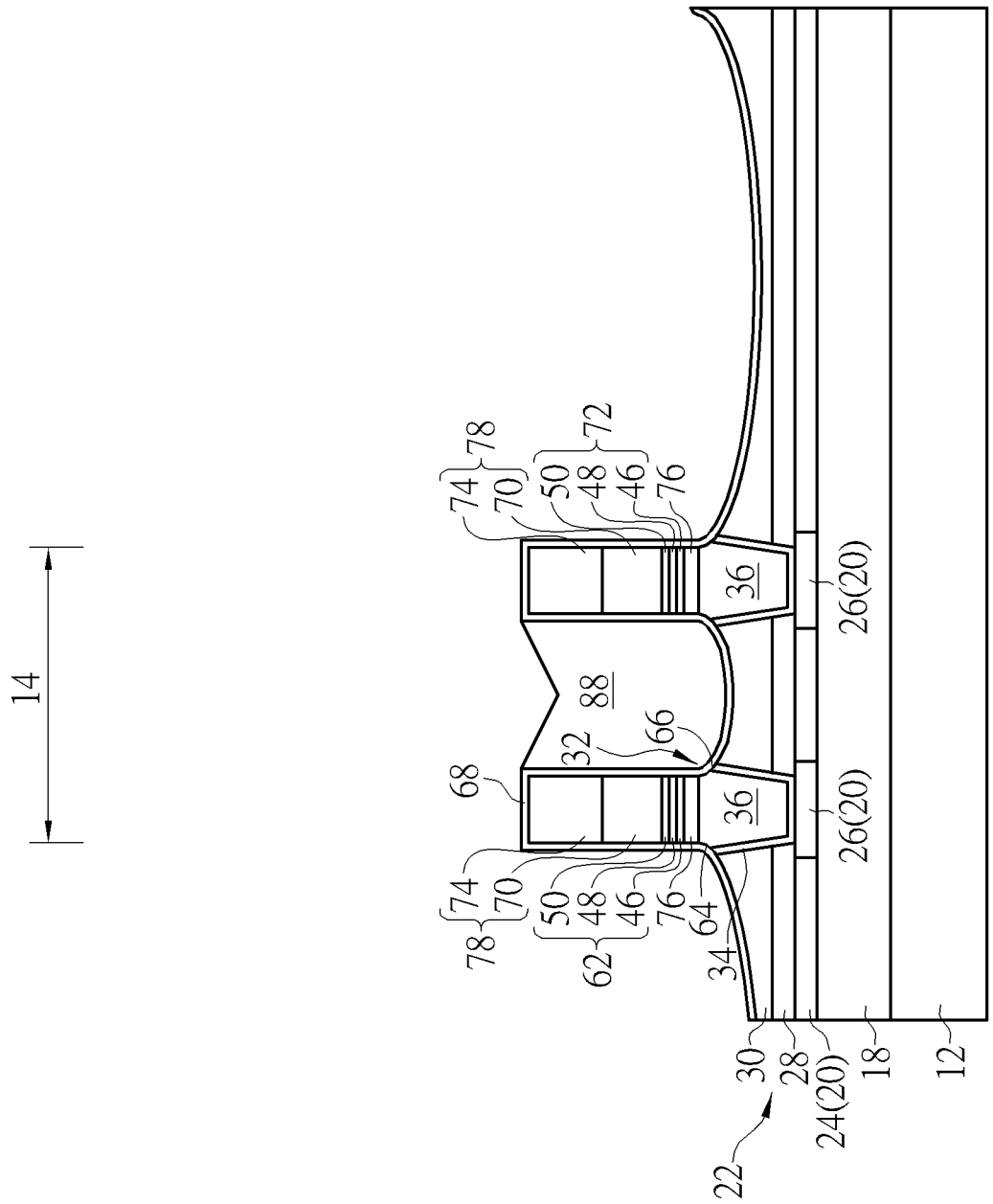
FIGS. 8-10 illustrate a method for fabricating a MRAM device according to an embodiment of the present invention.
Figure 9:
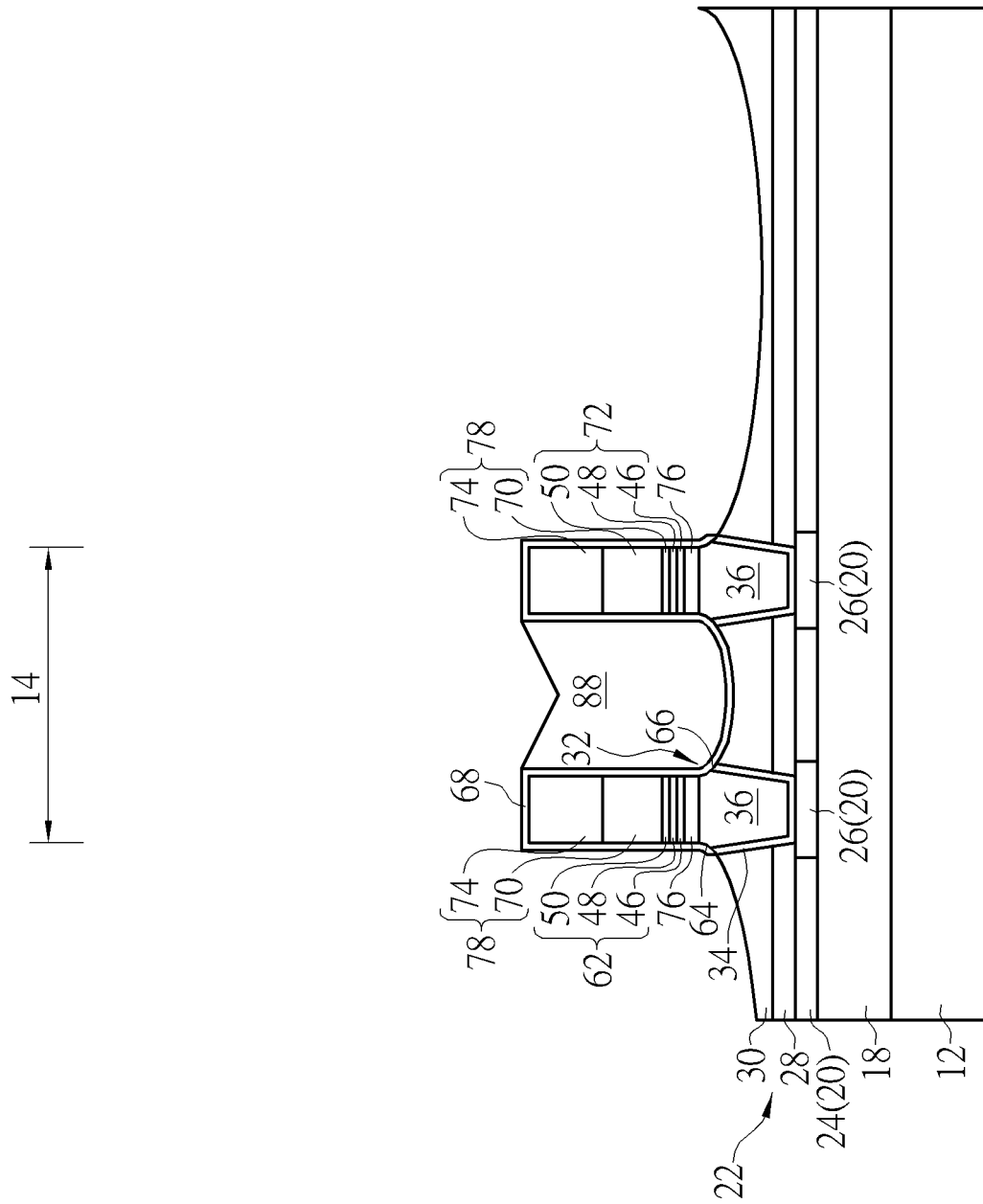
Figure 10:
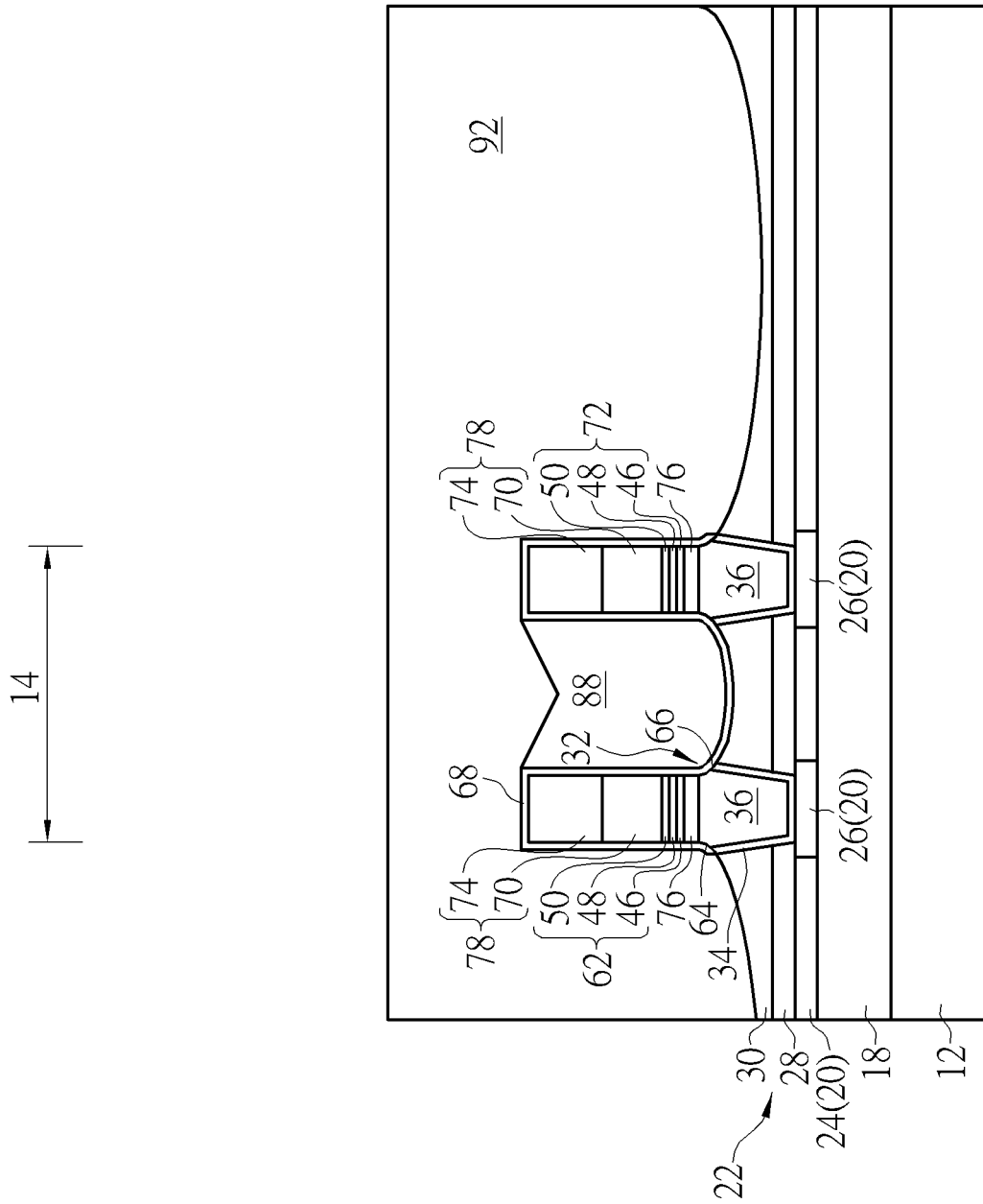

Referring to FIGS. 8-10, FIGS. 8-10 illustrate a method for fabricating a MRAM device according to an embodiment of the present invention. As shown in FIG. 8, it would be desirable to first conduct the aforementioned process from FIGS. 1-3 to form a cap layer 68 on the MTJs 62, 72 to cover the surface of the IMD layer 30, omit the etching process conducted to remove part of the cap layer 68 for forming spacers 80, 82, 84, 86 adjacent to the MTJs 62, 72 in FIG. 4, follow the processes conducted in FIGS. 5-6 to conduct an ALD process to form a passivation layer 88 covering the MTJs 62, 72 completely, and then conduct an etching back process to remove part of the passivation layer 88 so that the top surface of all of the remaining passivation layer 88 is lower than the top surface of the top electrodes 78. Similar to FIG. 6, the passivation layer 88 on left side of MTJ 62 and right side of MTJ 72 are removed at this stage so that all of the remaining passivation layer 88 is between the MTJs 62, 72, in which the top surface of the remaining passivation layer 88 between the MTJs 62, 72 includes a V-shape, all of the V-shape is lower than the top surface of the top electrode 78, and the angle included by the V-shape is preferably greater than 100 degrees.

Next, as shown in FIG. 9, a photo-etching process is conducted to remove all of the cap layer 68 outside the MTJ region 14, including all of the cap layer 68 on left side of MTJ 62 and right side of MTJ 72 so that the remaining cap layer 68 is still disposed on the top surface of the MTJs 62, 72, sidewalls of the MTJs 62, 72, and the surface of the IMD layer 30 between the MTJs 62, 72. It should be noted that since the cap layer 68 between the MTJs 62, 72 is untouched throughout the process, after the cap layer 68 outside the MTJ region 14 is removed by the aforementioned etching process the remaining cap layer 68 is still disposed between the passivation layer 88 and the IMD layer 30.

Next, as shown in FIG. 10, a ULK dielectric layer 92 is formed on the passivation layer 88, a planarizing process such as a chemical mechanical polishing (CMP) process is conducted to remove part of the ULK dielectric layer 92, and a metal interconnective process is conducted to form one or more IMD layers (not shown) and metal interconnections (not shown) embedded within the IMD layers for electrically connecting the MTJs 62, 72. Since the formation of IMD layers and metal interconnections electrically connecting the MTJs 62, 72, are well known to those skilled in the art, the details of which are not explained herein for the sake of brevity. This completes the fabrication of a MRAM device according to an embodiment of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a first magnetic tunneling junction (MTJ) and a second MTJ on a substrate;
   a first top electrode on the first MTJ and a second top electrode on the second MTJ;
   a cap layer on top surfaces of the first top electrode and the second top electrode and sidewalls of the first MTJ and the second MTJ;
   a passivation layer between the first MTJ and the second MTJ and on the cap layer, wherein a top surface of the passivation layer comprises a V-shape; and
   an ultra low-k (ULK) dielectric layer on and directly contacting the cap layer and the passivation layer and around the first MTJ and the second MTJ.

* * * * *